US 6,583,626 B2

(12) United States Patent
Rosenberger

(10) Patent No.: US 6,583,626 B2
(45) Date of Patent: Jun. 24, 2003

(54) METHOD FOR COMPENSATING FOR MEASURING ERROR IN DETECTING CURRENT IN AN ENERGY STORING MEANS

(75) Inventor: Marcus Rosenberger, Sersheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/936,471

(22) PCT Filed: Dec. 23, 2000

(86) PCT No.: PCT/DE00/04654

§ 371 (c)(1),
(2), (4) Date: Sep. 13, 2001

(87) PCT Pub. No.: WO01/51945

PCT Pub. Date: Jul. 19, 2001

(65) Prior Publication Data

US 2002/0158638 A1 Oct. 31, 2002

(30) Foreign Application Priority Data

Jan. 14, 2000 (DE) .......................................... 100 01 340

(51) Int. Cl.$^7$ ............................................. G01N 27/142
(52) U.S. Cl. ........................................ 324/425; 324/426
(58) Field of Search ................................. 320/132, 134, 320/162; 324/149, 425, 426, 601, 522, 115; 340/636; 702/57, 63, 64, 65, 86, 104, 107, 117, 124, 126, 189, 193, FOR 103, FOR 104, FOR 106, FOR 134, FOR 156, FOR 169, FOR 170, FOR 171, FOR 165; 714/724, 740, 745; 429/61, 90, 91

(56) References Cited

U.S. PATENT DOCUMENTS

| 5,337,013 A | 8/1994 | Langer ........................ 324/537 |
| 5,479,095 A | 12/1995 | Michalek et al. ........ 324/117 H |
| 5,640,081 A | * 6/1997 | Austin et al. ................ 320/127 |

FOREIGN PATENT DOCUMENTS

| DE | 43 12 760 A1 | 10/1994 | ........... G01R/19/00 |
| DE | 197 36 602 A | 3/1999 | ........... H01F/38/32 |
| DE | 197 36 602 A 1 | * 3/1999 | ........... H01F/38/32 |

OTHER PUBLICATIONS

Patent Abstracts of Japan vol. 1995, No. 02, Mar. 31, 1995 & JP 06 317636 A, Nov. 15, 1994.
Patent Abstracts of Japan vol. 2000, No. 08, Oct. 6, 2000 & JP 2000 137062 A, May 16, 2000.

* cited by examiner

Primary Examiner—N. Le
Assistant Examiner—John Teresinski
(74) Attorney, Agent, or Firm—Michael J. Striker

(57) ABSTRACT

The invention relates to a method for compensating for the measuring error in detecting current in an energy storing means (1), in which the detecting current is effected via a first current converter (9) and a second current converter (10) for higher currents, and the converter values (14), (15) of the two current converters (9), (10) are converted in an electronic evaluation unit (13) into measured values (17). The measured values for the battery current $I_{Batt.}$ (6) are measured with both current converters (9), (10) upon reaching a threshold (24), and from this the offset (27) of one current converter (10) is determined and corrected by the measured values (30).

6 Claims, 2 Drawing Sheets

Figure 1:
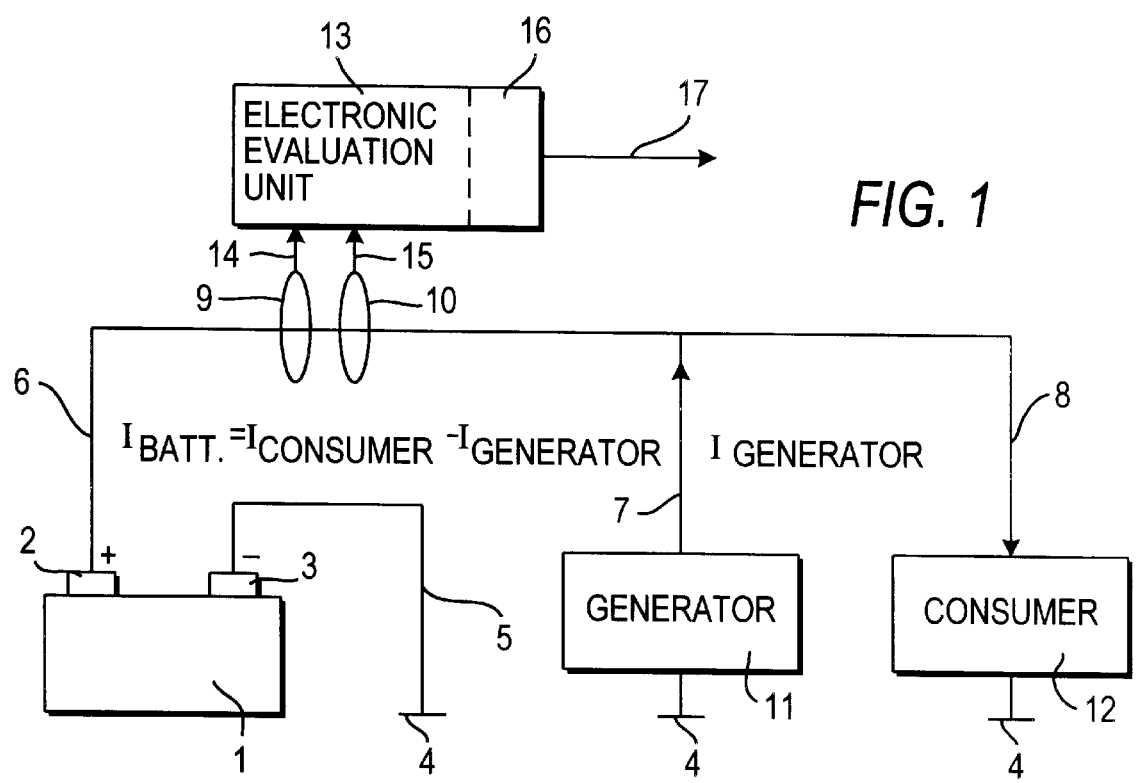

METHOD FOR COMPENSATING FOR MEASURING ERROR IN DETECTING CURRENT IN AN ENERGY STORING MEANS

FIELD OF THE INVENTION

The invention relates to a method for compensating for measuring error in detecting the currents in an energy storing means in order to ascertain its charge state. The currents that are drawn from the battery or fed into the battery are measured continuously by means of a current measurement. The measured values detected are either integrated or added up over time. The remaining charge in the energy storing means is found on this basis.

PRIOR ART

German Patent Disclosure DE 4 312 760 A1 discloses a terminal with integrated current measurement. In electronic devices for regulating flows or power levels, current measurement devices are used, as well as input and/or output terminals suitable for corresponding currents. In the prior art, these elements are disposed separately in the device and require a large volume and major expenditure for wiring. By integrating a current meter without a soft magnetic core for guiding the magnetic field, the current sensor can be integrated into the terminal without significantly increasing its structural volume.

To ascertain the remaining charge in an energy storing means, such as a battery, the incoming and outgoing currents are measured by means of current converters. To detect the largest possible measurement range with high precision, two current converters are used. A small current converter is used to detect low currents, while a large converter is used for detecting high currents in the upper measurement range. If the current to be measured exceeds a certain threshold value, then the measurement of the current moves from the first current converter to the second current converter, until the current to be measured drops below the threshold again.

The measurement outcome obtained in this way involves a measuring error, which is composed essentially of two parts, namely a part independent of the measured value (known as the offset) and a part that is dependent on the measured value. The absolute measuring error increases with the size of the current converter. The precision of a current measurement made with a small current converter is therefore greater. The point, the part of the measuring error that is independent of the measured value, that is, the offset, is caused both by the measuring converter and the downstream electronic evaluation unit and is dependent on the temperature. If the remaining charge in an energy storing means is ascertained using two current converters for low and higher currents, it is adulterated in particular by the offset error of the larger current converter, since because of the ensuing integration over time this error is multiplied.

SUMMARY OF THE INVENTION

By means of the invention, a permanent calibration takes place of the part of the measuring error, or offset, that is independent of the measured value and is established in the large current converter. As a result, the offset error of the large converter can be compensated for, and more-precise detection of the battery current and thus a more accurate ascertainment of the remaining charge can be brought about.

By the detecting current by both current converters within one measurement range that is common to both converters, a calibration of the converter values obtained can be performed. In this common measurement range of the detecting current, the second converter for the higher currents generates a measuring error, which is dominated by the offset error. By means of the method according to the invention, the outcome of measurement of the second converter for high currents can be calibrated by means of the outcome of measurement obtained simultaneously, and in parallel, by the first converter for lower currents, so that the measurement involving the greater proportion of offset error performed by the second converter for higher currents, which considerably adulterates the overall outcome, can be corrected. The correction of the converter values of the second converter for higher currents is expediently done prior to the integration of the measured values.

DRAWING

The invention will be described in further detail below in conjunction with the drawing.

Shown are:

FIG. 1, a circuit configuration for detecting the current of an energy storing means for ascertaining the remaining charge.

Figure 2:
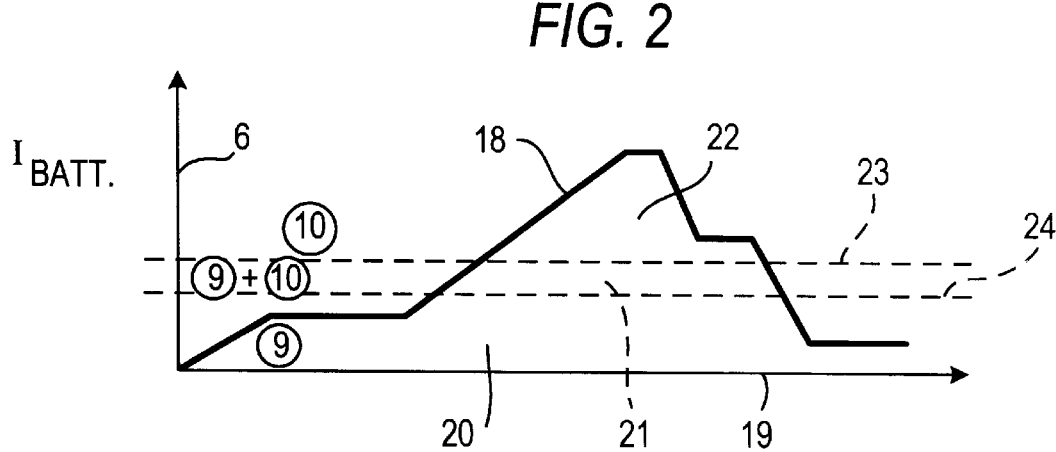

FIG. 2, an example of a course of battery current, with measurement ranges drawn in.

Figure 3:
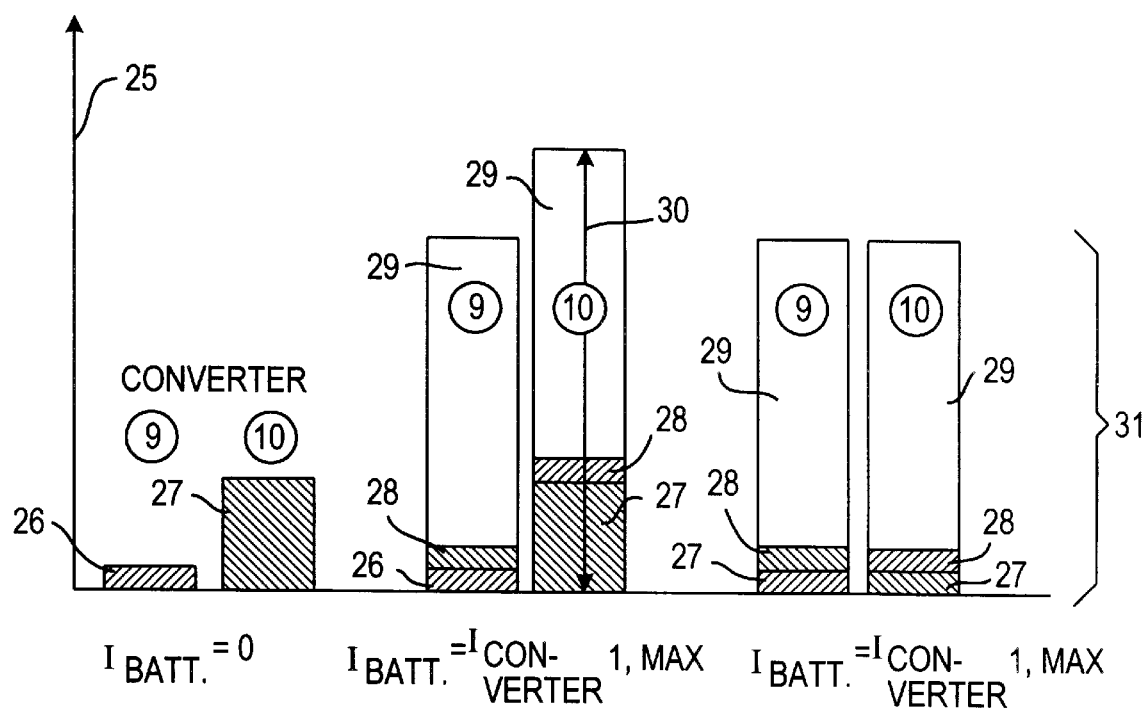

FIG. 3, the comparison of the offset values of the converters, the uncompensated and the compensated outcomes of measurement, and the outcomes of measurement compensated according to the invention.

VARIANT EMBODIMENTS

The illustration in FIG. 1 shows a current configuration with which the detecting current in an energy storing means can be done, to ascertain its remaining charge.

The energy storing means 1—embodied preferably as a battery for motor vehicles—has a positive pole 2 and a negative pole 3, which is connected to ground 4 via a ground line 5. Reference numeral 6 indicates the battery current $I_{Batt.}$, which is the difference between the currents 8, namely the consumer current $I_{Consumer}$ and the current 7, namely the generator current $I_{Generator}$. If more current is consumed than a generator 11 furnishes, then the energy storing means 1 is discharged and the battery current $I_{Batt.}$ is positive. Conversely, if less current is consumed than the generator 11 furnishes, the energy storing means 1 is charged by the generator 11; in that case, the battery current $I_{Batt.}$ has a negative sign. The generator 11 likewise has a ground 4, as does the consumers 12, shown only schematically, which are also connected to the ground. As examples of electrical consumers, the lighting system and windshield wiper of a motor vehicle can be named.

The battery current $I_{Batt.}$, reference numeral 6, shown flowing away from the positive pole 2 in the exemplary embodiment shown, moves past two current converters 9 and 10 connected in series with one another. The first current converter 9 detects currents in a lower range and covers the lower measurement range, while the second current converter 10 detects the higher currents in the upper measurement range. The current converter 9 mentioned first as a rule measures the more-precise measured values, since the absolute measuring error tends to increase with the size of whatever current converter is used. In general, the measuring error of a current converter is composed of a component (offset) that is independent of the measured value and a component that is dependent on the measured value.

However, the part of the measuring error that is independent of the measured value has far more grave effects upon the integration of the measured values, since in an ensuing integration and the measuring errors are multiplied, thus reduce the accuracy of a remaining charge ascertained in this way considerably.

The two current converters 9 and 10 forward the respective converter values 14 and 15 to the electronic evaluation unit 13, in which a correction stage is integrated. Before the measured values 17 are added up or are integrated over time, they are calibrated by the error component, that is, the offset 26 or 27, so that an adulteration of the remaining charge from the multiplication of the measuring error in the integration is precluded. The corrected measured values 17 ascertained in the correction stage 16 are transmitted to a higher-ranking function unit in which further processing of the corrected measured values takes place.

FIG. 2 shows a course profile with measurement ranges shown, the profile being taken as an example.

In this illustration, one possible curve course 18 of the battery current 6 $I_{Batt.}$ is plotted, this curve being near what occurs in practice; the lower and upper limits 24 and 23, respectively, extending parallel to the time axis 19 are plotted and define a common measurement range 21 of the two current converters 9 and 10. Beginning at the origin, a first portion of the curve course 18 extends through the measurement range 20 for low currents, where the detecting current is done solely by the current converter 9 for low currents. The magnitude of the current in this measurement range 20 is below the lower limit 24 of the common measurement range 21 adjoining it, in which the detecting current is done by both current converters 9 and 10.

If the battery current 6 $I_{Batt.}$ rises further, as shown in FIG. 2, it departs from the measurement range 20 in which only the first current converter 9 measures the current. Once the current intensity has grown to values that are within the common measurement range 21, the detecting current is performed by the first current converter 9 and the second current converter 10 in common, as represented by the circled reference numerals 9 and 10, respectively, inside the measurement range 21. As a result of the common ascertainment of the battery current 6 that is done in this measurement range 21, two converter values 14 and 15 are ascertained, respectively, which are evaluated in the electronic evaluation unit 13. Within the measurement range 21 common to both current converters 9 and 10, the ascertainment of the offset 27 of the large current converter 10 is done, by which offset the measured values 30 (see FIG. 3) ascertained by the large current converter 10 are to be corrected.

If the current intensity of the battery current 6 $I_{Batt.}$ increases still further, then the curve course 18 as it continues leaves the measurement range 21 covered in common by both converters 9 and 10 and enters the measurement range 22, within which the detecting current is done solely by the second current converter 10 for higher currents. From the measurement of the battery current 6 by both current converters 9 and 10, the error component or offset 27 of the second current converter 10, which offset is independent of the measured value, is known and can be used, in the ensuing evaluation in the correction stage 16 that follows the transmission of the converter values 14 and 15 to the electronic evaluation unit 13, to correct the measured values of the second converter 10.

FIG. 3, finally, shows the comparison of the measured values ascertained by the first current converter and the second current converter, as well as the corrected measured values of the second current converter.

In the left-hand portion of the coordinate system of FIG. 3, the resultant converter values 25 of the first converter 9 and of the second converter 10 are plotted for the battery current 6, where $I_{Batt.}=0$. From a comparison, represented by the bar shown shaded in the graph, it can be seen that the offset 26 of the first current converter 9 is substantially less than the offset, identified by reference numeral 27, of the second converter 10. The respective offset 26 and 27 of the corresponding current converters 9 and 10 represents the measuring error that is independent of the measured value in the detecting current done by the respective current converter.

In the detecting current, in addition to the error component independent of the measured value, that is, the offset 26 or 27, a component 28 of the measuring error occurs that is dependent on the measured values. This error is identified by reference numeral 28 in the middle pair of bar graphs shown in FIG. 3. For the first and second current converter 9 and 10, respectively, the error 28 that is dependent on the measured value is the same, and therefore this error component cannot cause any excessive adulteration of a remaining charge to be generated by the detecting current. In the middle pair of bar graphs in FIG. 3, the actual battery currents $I_{Batt., actual}$ are identified by reference numeral 29; the measured value 30 that has the measuring error component 27 that is not dependent on the measured value and that is not compensated is markedly greater than the measured value ascertained by the first current converter 9. The measured value 30 of the second current converter 10 is composed of the actually measured battery current $I_{Batt., actual}$ 29, the error component 28 that is dependent on the measured value, and the error component 27 or offset that is independent of the measured value. The same applies to the measured value detected by the first current converter 9, whose offset 26 is markedly less than that of the second current converter 10.

A calibration of the two error components 26, 27 that are independent of the measured value by forming the difference between the measured values and reducing the measured values 15 of the second current converter 10 by the ascertained difference leads to the pair of bar graphs identified by reference numeral 31. In this pair of graphs, the measured values 31 ascertained by the two current converters 9 and 10 agree; the bar graph for the first current converter 9 corresponds to that of the first current converter 9 for the middle pair of bar graphs.

LIST OF REFERENCE NUMERALS

1. Energy storing means
2. Positive pole
3. Negative pole
4. Ground
5. Ground line
6. $I_{Batt.}$ (battery current), current from energy storing means
7. $I_{Generator}$ Generator current
8. $I_{Consumer}$ Consumer currents
9. First current converter
10. Second current converter
11. Generator
12. Consumer
13. Electronic evaluation unit
14. Converter value
15. Converter value
16. Correction stage
17. Measurement value 18. Course of $I_{Batt.}$ (battery current)
19. Time axis
20. Measurement range for low currents
21. Common measurement range of both current converters
22. Measurement range for higher currents
23. Upper limit
24. Lower limit
25. Converter values
26. Offset of first current converter
27. Offset of second current converter
28. Error dependent on measured value
29. $I_{Batt., actual}$
30. Uncompensated measured value of second converters
31. Compensated measured value of second current converters

What is claimed is:

1. A method for compensating for measuring error in detecting current in an energy storing means (1), in which the detecting current is done via a first current converter (9) for low currents and via a second current converter (10) for higher currents, and the converter values (14), (15) are converted in an electronic evaluation unit (13) into measured values (17), characterized in that the measured values of the battery current (6) are measured with both current converters (9), (10) simultaneously upon reaching threshold (24), and from this measurement the offset (27) of one current converter (10) is determined and corrected by the measured values, wherein a difference between the measured values (14, 15) of the first and second current converter (9, 10) is essentially equivalent to the offset error (27) of the second current converter (10) for higher currents, and wherein the measured values (30) of the second current converter (10) are done in a correction stage (16) of an electronic evaluation unit (13) before integration of the measured values.

2. The method of claim 1, characterized in that the battery current (6) is measured within a measurement range (21) by both current converters (9), (10).

3. The method of claim 2, characterized in that the common measurement range (21) is defined by an upper limit (23) and a lower limit (24).

4. The method of claim 1, characterized in that the difference between the measured values (14, (15) of the first and second current converter (9), (10) is ascertained in the electronic evaluation unit (13).

5. The method of claim 1, characterized in that the measured values (30) of the second current converter (10) for higher currents are corrected by the ascertained offset (27) of the first current converter (10).

6. The method of claim 1, characterized in that the measured values (14) of the first current converter (9) for lower currents are calibrated in the common measurement range (21) using the measured values (15) of the second current converter (10) for higher currents.

* * * * *